United States Patent
Cheng et al.

(10) Patent No.: US 8,969,966 B2
(45) Date of Patent: Mar. 3, 2015

(54) DEFECTIVE P-N JUNCTION FOR BACKGATED FULLY DEPLETED SILICON ON INSULATOR MOSFET

(71) Applicants: International Business Machines Corporation, Armonk, NY (US); STMicroelectronics, Inc., Coppell, TX (US); Commissariat a l'Energie Atomique et aux Energies Alternatives, Grenoble Cedex 9 (FR)

(72) Inventors: Kangguo Cheng, Schenectady, NY (US); Bruce B. Doris, Brewster, NY (US); Laurent Grenouillet, Rives (FR); Ali Khakifirooz, Mountain View, CA (US); Yannick Le Tiec, Crolles (FR); Qing Liu, Guilderland, NY (US); Maud Vinet, Rives sur Fure (FR)

(73) Assignees: International Business Machines Corporation, Armonk, NY (US); STMicroelectronics, Inc., Coppell, TX (US); Commissariat a l'Energie Atomique et aux Energies Alternatives, Grenoble Cedex 9 (FR)

( * ) Notice: Subject to any disclaimer, the term of this patent is extended or adjusted under 35 U.S.C. 154(b) by 0 days.

(21) Appl. No.: 13/866,077

(22) Filed: Apr. 19, 2013

(65) Prior Publication Data
US 2014/0312461 A1    Oct. 23, 2014

(51) Int. Cl.
*H01L 21/336* (2006.01)
*H01L 21/761* (2006.01)
*H01L 29/06* (2006.01)
*H01L 29/66* (2006.01)
*H01L 29/786* (2006.01)

(52) U.S. Cl.
CPC .......... *H01L 21/761* (2013.01); *H01L 29/0684* (2013.01); *H01L 29/66772* (2013.01); *H01L 29/78612* (2013.01)
USPC .................... 257/349; 257/E21.415; 438/526

(58) Field of Classification Search
CPC ................... H01L 29/66772; H01L 29/78612; H01L 29/78621
USPC .................... 257/347, 349, E21.415; 438/526
See application file for complete search history.

(56) References Cited

U.S. PATENT DOCUMENTS 4,956,311 A * 9/1990 Liou et al. ...................... 438/231
6,395,587 B1 5/2002 Crowder et al.
6,414,340 B1 7/2002 Brar (Continued)

OTHER PUBLICATIONS

Chang, M., et al. "Transistor- and Circuit-Design Optimization for Low-Power CMOS" IEEE Transactions on Electron Devices. vol. 55, No. 1. Jan. 2008. pp. 84-95.

(Continued)

*Primary Examiner* — John C Ingham
(74) *Attorney, Agent, or Firm* — Tutunjian & Bitetto, P.C.; Vazken Alexanian

(57) ABSTRACT

Methods for semiconductor fabrication include forming a well in a semiconductor substrate. A pocket is formed within the well, the pocket having an opposite doping polarity as the well to provide a p-n junction between the well and the pocket. Defects are created at the p-n junction such that a leakage resistance of the p-n junction is decreased.

17 Claims, 7 Drawing Sheets

(56) References Cited

U.S. PATENT DOCUMENTS

| | | |
|---|---|---|
| 6,794,717 B2 | 9/2004 | Matsumoto et al. |
| 7,521,776 B2 * | 4/2009 | Cannon et al. ............... 257/627 |
| 7,829,421 B2 | 11/2010 | Wei et al. |
| 7,943,997 B2 | 5/2011 | Adkisson et al. |
| 8,067,804 B2 * | 11/2011 | Maegawa et al. ............. 257/349 |
| 2011/0115021 A1 * | 5/2011 | Dennard et al. ............. 257/347 |
| 2011/0227159 A1 | 9/2011 | Chan et al. |
| 2012/0132990 A1 | 5/2012 | Zhu et al. |

OTHER PUBLICATIONS

Kim, Y. "Challenges for Nanoscale MOSFETs and Emerging Nanoelectronics" Transactions on Electrical and Electronic Materials. vol. 11, No. 3. Jun. 2010. pp. 93-105.

Lin, Y., et al. "A Novel FDSOI MOSFET With Block Oxide Enclosed Body" IEEE International Conference on Integrated Circuit Design and Technology. 2006. pp. 1-4.

* cited by examiner

DEFECTIVE P-N JUNCTION FOR BACKGATED FULLY DEPLETED SILICON ON INSULATOR MOSFET

BACKGROUND

1. Technical Field

The present invention relates to semiconductor fabrication, and more particularly to forming a defective p-n junction for backgated fully depleted silicon on insulator devices.

2. Description of the Related Art

In ultrathin fully depleted silicon on insulator (FDSOI) with thin buried oxide (BOX), pocket implants are placed underneath the BOX to adjust the threshold voltage Vt of the transistors. For example, with a BOX thickness of about 25 nm, changing the implant polarity shifts the threshold voltage by about 80 mV. To modulate the threshold voltage of the transistors during operation, a backgate voltage (backbias) is applied. To minimize the area penalty for connecting the backbias, it is applied to a well that is shared by several transistors. For those transistors that have a pocket implant, the backbias is applied to the BOX through a p-n junction that is located in series with the BOX. Since there is no DC current flowing through the p-n junction, in DC operation the backbias drops at the back interface of the BOX. However, during AC operation, there is a capacitive voltage divider formed by the MOS (metal-oxide-semiconductor) capacitor associated with the BOX and the depletion capacitor associated with the p-n junction between the well and pocket such that not all of the voltage drops across the BOX, causing the actual backbais to fluctuate.

SUMMARY

A method for semiconductor fabrication includes forming a well in a semiconductor substrate. A pocket is formed within the well, the pocket having an opposite doping polarity as the well to provide a p-n junction between the well and the pocket. Defects are created at the p-n junction such that a leakage resistance of the p-n junction is decreased.

A method for semiconductor fabrication includes forming a well in a semiconductor substrate. A pocket is formed within the well, the pocket having an opposite doping polarity as the well to provide a p-n junction between the well and the pocket, wherein the pocket is formed under an isolation layer of the semiconductor substrate. Defects are created at the p-n junction such that a leakage resistance of the p-n junction is decreased, wherein the defects are created as part of a same implantation used to form the pocket.

A semiconductor device includes a semiconductor substrate having a well formed therein. A pocket is formed within the well, the pocketing having an opposite doping polarity as the well to provide a p-n junction between the well and the pocket. Defects are created at the p-n junction such that a leakage resistance of the p-n junction is decreased.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
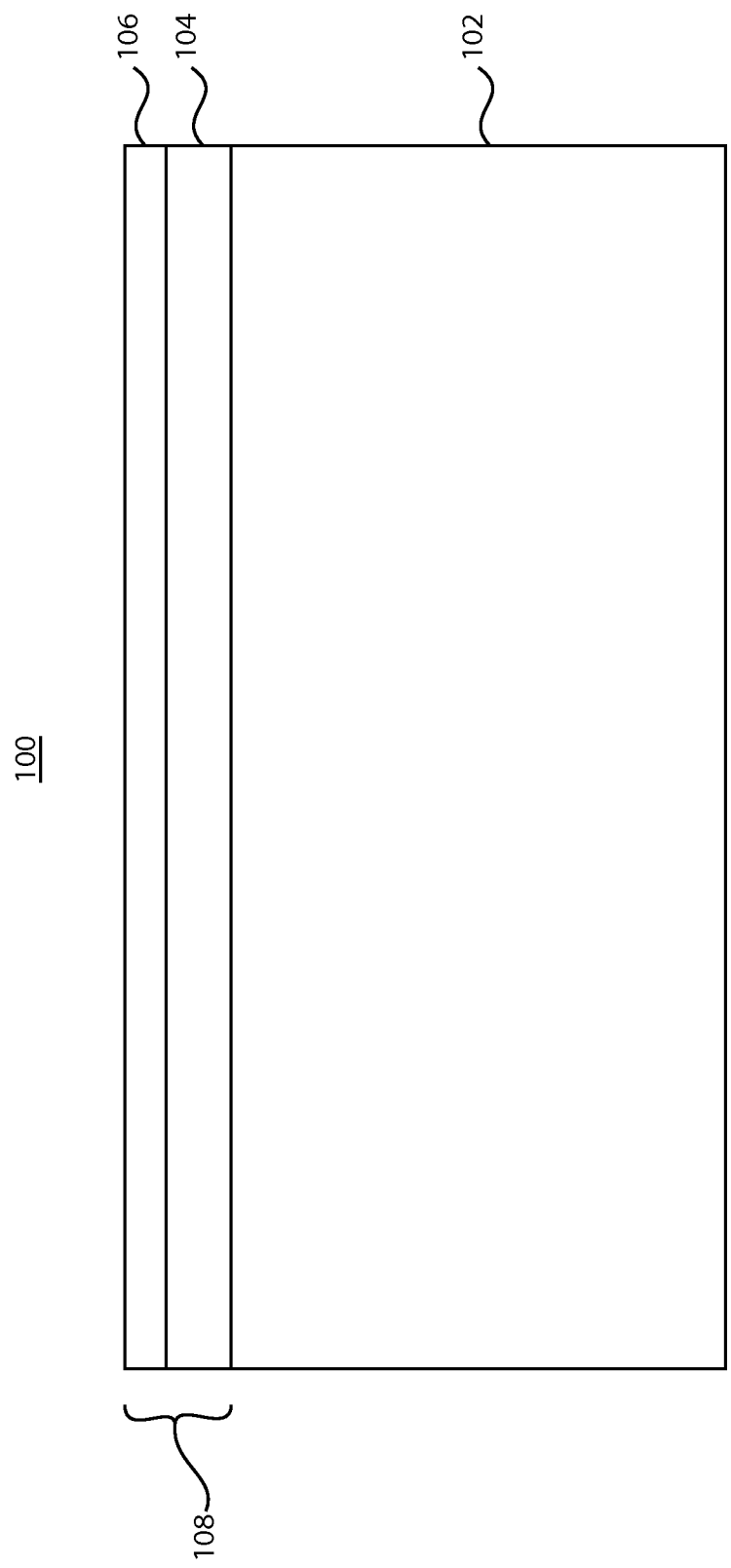
FIG. 1 is a cross-sectional view of a semiconductor device having a semiconductor-on-insulator layer formed over a buried oxide (BOX) layer, in accordance with one illustrative embodiment.

In accordance with the present principles, methods and semiconductor devices are provided for a defective p-n junction for backgated fully depleted semiconductor-on-insulator (FDSOI) MOSFETs (metal-oxide-semiconductor field-effect transistor). The FDSOI includes a well and a pocket formed within the well. Defects are formed at the interface between the well and the pocket. Preferably, the interface includes a p-n junction. The defects may include end-of-range implant defects or impurities that generate mid-gap states. In one embodiment, the defects are formed as part of a same implantation used to form the pocket. In another embodiment, the defects are formed by a separate blanket implantation.

One advantage of the present principles is that defects are formed at the interface between the pocket and the well such that the junction is leaky. During AC (alternating current) operation, most of the applied voltage drops at the buried oxide interface.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a semiconductor structure 100 is illustratively depicted in accordance with one embodiment. The semiconductor structure 100 is formed in a semiconductor substrate 102, which may include bulk silicon, monocrystalline silicon, germanium, gallium arsenide, or any other suitable material or combination of materials. Substrate 102 preferably includes a buried oxide (BOX) layer 104 and semiconductor-on-insulator (SOI) layer 106 formed in or on the substrate 102.

BOX layer 102 and SOI layer 106 may form an ultrathin body and BOX (UTBB) 108, also referred to an ultrathin fully depleted SOI (FDSOI) layer with thin BOX layer. BOX layer 104 is preferably a thin BOX layer, e.g., at or about 10-50 nm, but may also include other thicknesses (e.g., ultrathin, etc.). BOX layer 104 may include silicon dioxide, silicon nitride, or any other suitable dielectric material. SOI layer 106 is preferably an ultrathin SOI layer, e.g., at or about 2-10 nm, but may also include other thicknesses. SOI layer 106 may include any suitable semiconductor such as, e.g., silicon, germanium, silicon germanium, a group III-V semiconductor such as, e.g., gallium arsenide, a group II-VI semiconductor, etc. In some embodiments, the semiconductor structure 100 further comprises other features or structures that are formed in previous process steps.

Figure 2:
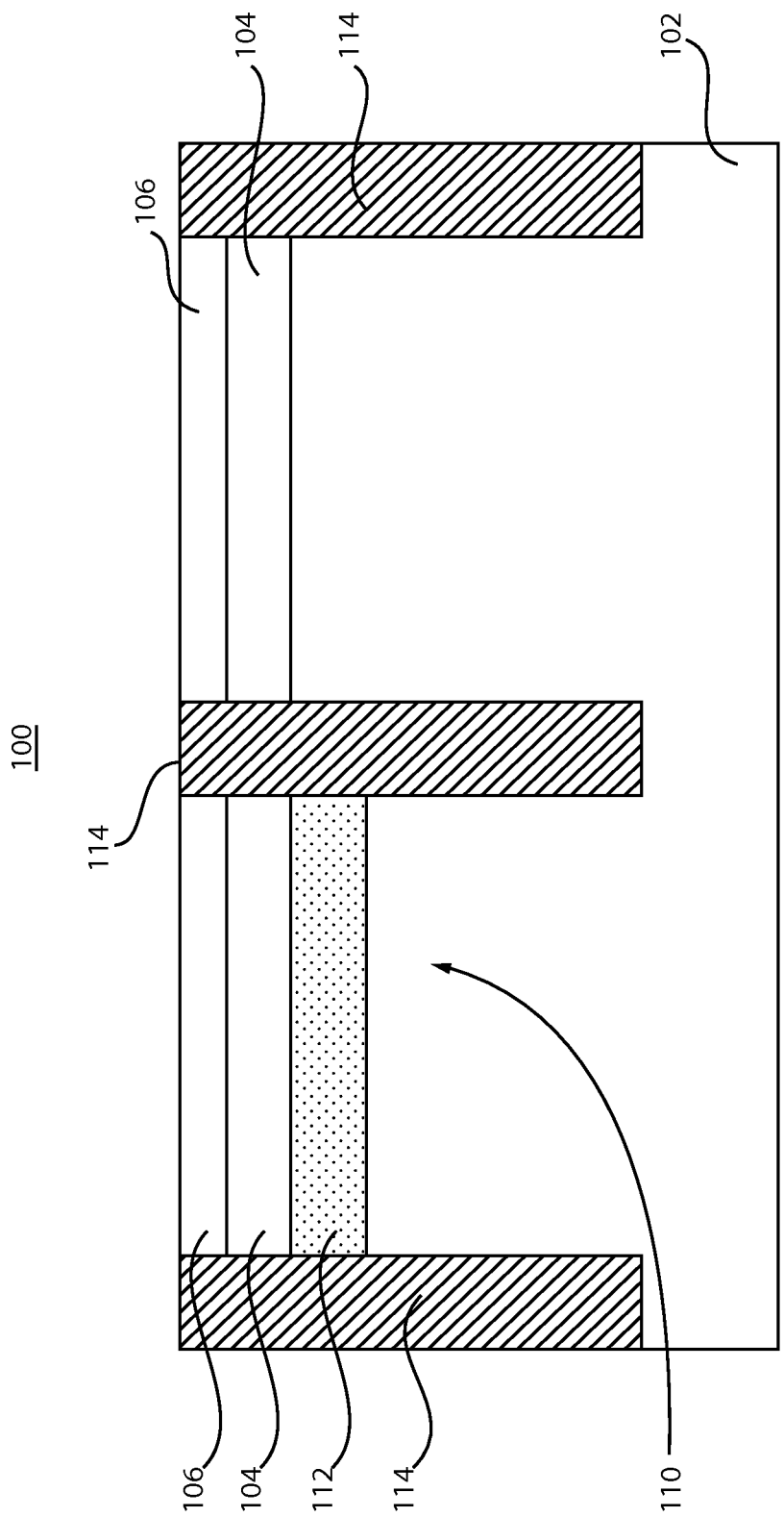
FIG. 2 is a cross-sectional view of a semiconductor device after formation of a well, a pocket and shallow trench isolation regions, in accordance with one illustrative embodiment.

Referring now to FIG. 2, processing of the semiconductor structure 100 continues. Well 110 is formed in substrate 102 by doping portions of substrate 102. In one embodiment, formation of well 110 may include forming a resist pattern (not shown) to protect portions of the substrate 102. Substrate 102 undergoes ion implantation to implant dopants into unprotected portions of substrate 102. Dopants may include, e.g., P-type dopants such as Boron, Boron Fluoride, etc. to form a p-well, applied at an implant dose range from, e.g., $10^{13}/cm^2$ to $10^{16}/cm^2$, with an implant energy range from, e.g., 2 KeV to 200 KeV, depending on the implant species. Dopants may also include, e.g., N-type dopants such as Arsenic, Phosphorus, etc. to form an n-well, applied at an implant dose range from, e.g., $10^{13}/cm^2$ to $10^{16}/cm^2$, with an implant energy range from, e.g., 10 KeV to 200 KeV, depending on the implant species.

Ion implantation includes bombarding through UTBB 108 into substrate 102 with ions at angles of approximately 5 degrees to about 75 degrees with respect to a vertical-normal to a major surface of the device. Other angles of attack may also be employed. The parameters of the ion implantation may be adjusted to provide a desired dopant level and depth. In some embodiments, multiple ion implantations may be employed having different doses and energies to provide the desired dopant profile in the well 110.

It should be understood that other techniques for forming well 110 may also be employed. For example, well 110 may be epitaxially grown on the substrate 102 before BOX 104 and SOI layer 106 are formed.

A pocket 112 is formed in substrate 102 by implantation such that a p-n junction is formed between pocket 112 and well 110. Pocket implants are formed under BOX layer 104 by doping substrate 102 with opposite doping polarity of the well 110. For example, if the well 110 is doped with a P-type dopant, the pocket 112 is formed by implanting an N-type dopant. The pocket 112 provides for the adjustment of the threshold voltage of the transistors.

Formation of pocket 112 may include forming a resist pattern (not shown) to protect portions of the substrate 102 and employing ion implantation to implant dopants into unprotected portions of substrate 102. Dopants may include, e.g., P-type dopants such as Boron, Boron Fluoride, etc., applied at an implant dose range from, e.g., $10^{13}/cm^2$ to $10^{16}/cm^2$, with an implant energy range from, e.g., 5 KeV to 100 KeV, depending on the implant species. Dopants may also include, e.g., N-type dopants such as Arsenic, Phosphorus, etc., applied at an implant dose range from, e.g., $10^{13}/cm^2$ to $10^{16}/cm^2$, with an implant energy range from, e.g., 10 KeV to 100 KeV, depending on the implant species. Dopant type, energy and dosage are selected such that a p-n junction is formed between pocket 112 and well 110.

Ion implantation includes bombarding through UTBB 108 into substrate 102 with ions at angles of approximately 5 degrees to about 75 degrees with respect to a vertical-normal to a major surface of the device. Other angles of attack may also be employed. The parameters of the ion implantation may be adjusted to provide a desired dopant level and depth.

Shallow trench isolation (STI) dielectric regions 114 are formed by conventional methods to electrically separate devices and reduce parasitic currents and charge buildup. STI regions 114 may include an oxide, e.g., a silicon oxide. It should be understood that STI regions 114 may be formed before and/or after the formation of well 110 and pocket 112.

Electrical defects 116 (shown in FIGS. 3 and 4) are formed at or around the interface between well 110 and pocket 112 such that during device operation the defects are located inside the depletion region formed at the p-n junction between the well 110 and pocket 112. Defects 116 cause the p-n junction between well 110 and pocket 112 to be leaky such that, during AC (alternating current) operation, most of the applied voltage drops at the interface of BOX layer 104 and pocket 112. Defects 116 may include end-of-range implant defects and impurities that generate mid-gap states. Other defects are also contemplated. It should be understood that defect formation may be performed at any point during fabrication. Defect density is preferably at a range of, e.g., $10^{12}/cm^2$ to $10^{14}/cm^2$.

End-of-range (EOR) defects refer to the crystallographic defects formed at or near the interface between an implanted region in a crystalline substrate and the un-implanted region underneath. EOR defects can be formed for example by implanting the substrate with heavy ions such as, e.g., silicon, germanium, xenon, etc. so that crystal defects are formed at a desired depth. Alternatively, heavy ion implantation can be formed at a dose and energy sufficient to amorphize a portion of the substrate and a subsequent thermal annealing such that the amorphized region is recrsytallized. Defects are formed at the interface between the recrystallized region and the substrate region underneath.

Typically, ion implantation with a dose range of, e.g., $10^{13}/cm^2$ to $10^{16}/cm^2$ may be sufficient to create EOR defects. The energy is selected based on the ion implant species such that the defects are formed at or near the p-n junction formed between the pocket 112 and well 110. EOR defects are formed at a depth such that they are located inside the depletion region associated with the p-n junction between the pocket 112 and well 110. The presence of the EOR defects enhances the generation-recombination (G-R) rate of electrons and holes inside the depletion region and thus makes the p-n junction leaky.

In other embodiments, the G-R rate can be enhanced by implanting species that form mid-gap states in the p-n junction. For example, metals such as, e.g., iron form mid-gap states in crystalline silicon and enhance the G-R rate.

Figure 3:
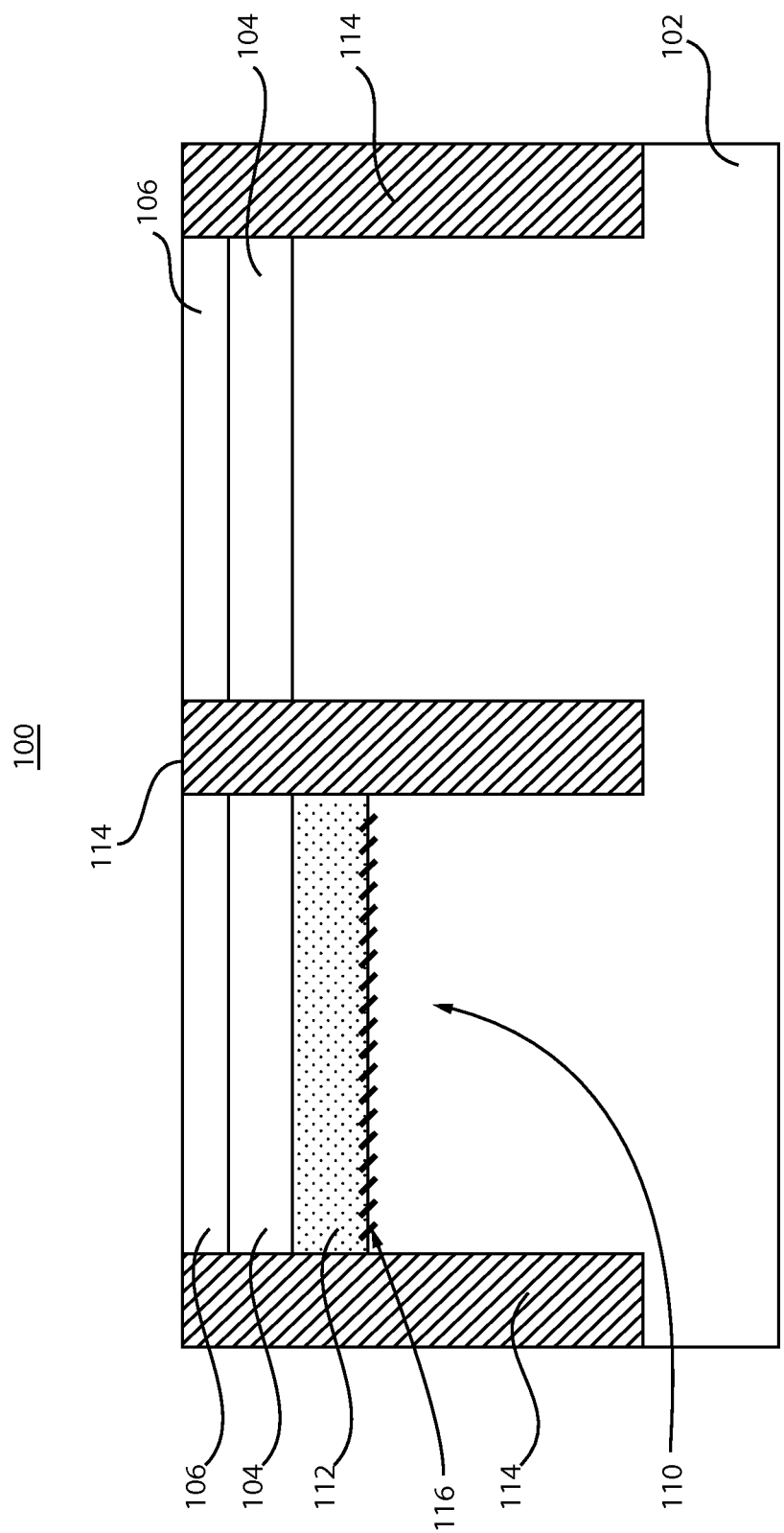
FIG. 3 is a cross-sectional view of a semiconductor device having defects at the intersection of the pocket and the well, formed as part of a same implantation used to form the pocket, in accordance with one illustrative embodiment.

Referring now to FIG. 3, in accordance with one embodiment, defects are formed in semiconductor structure 100 as part of the ion implantation used to form pocket 112. The parameters (e.g., implant range, implant energy, etc.) of the ion implantation used to form pocket 112 may be adjusted such that defects 116 are formed at the interface between pocket 112 and well 110. Defects can be formed by selecting the energy and dose of the ion implantation species that is used to form the pocket 112. In other embodiments, a separate, typically heavy ion implantation is used but with the same mask used to define the pocket 112. Since defects are formed as part of the pocket implantation, defects 116 are not formed where the pocket is not formed.

Figure 4:
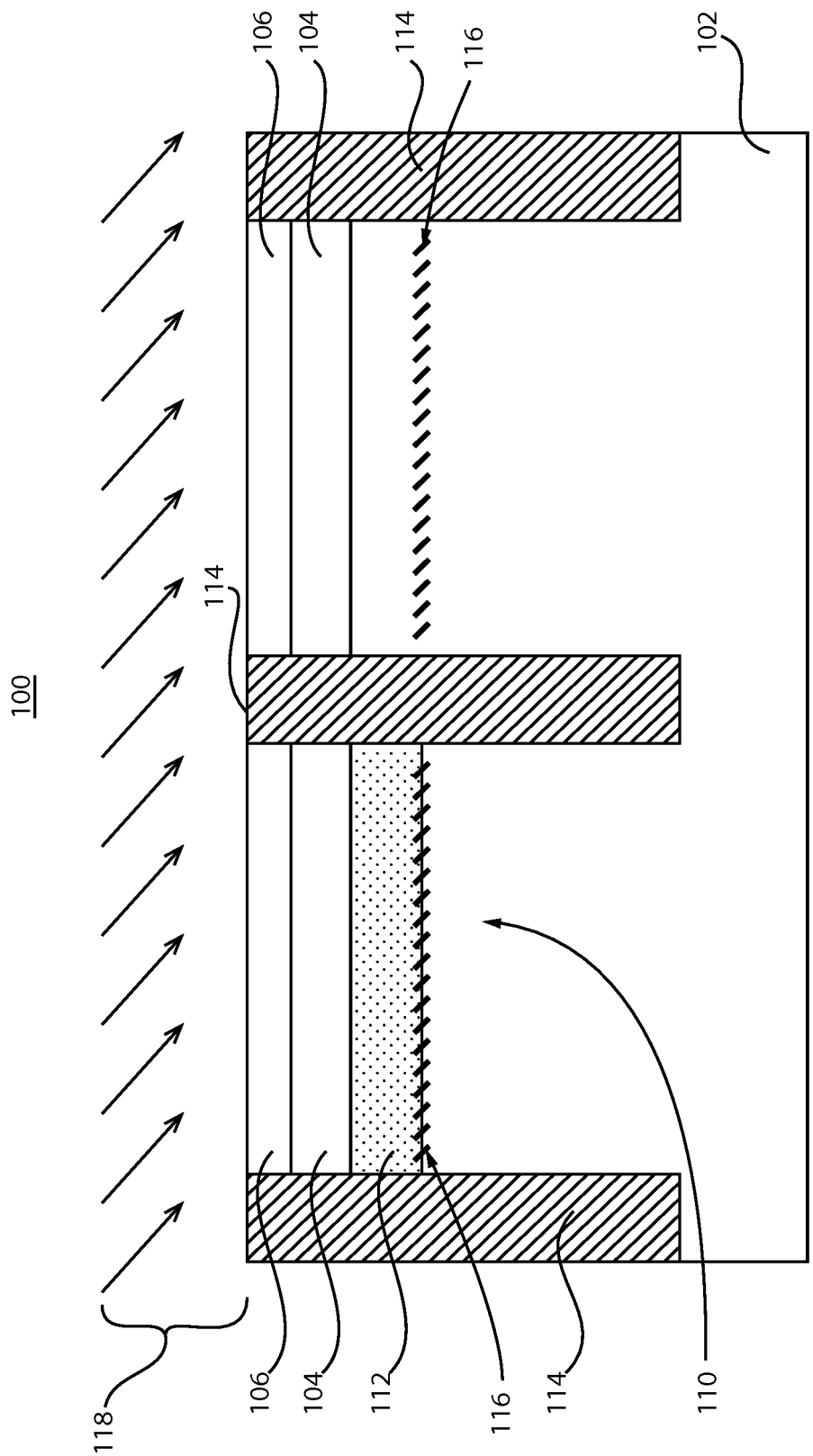
FIG. 4 is a cross-sectional view of a semiconductor device having defects at the intersection of the pocket and the well, formed during a separate blanket implantation, in accordance with one illustrative embodiment.

Referring now to FIG. 4, in accordance with another embodiment, defects are formed in semiconductor structure 100 as part of a blanket ion implantation. A blanket ion implantation 118 is applied over the substrate 102 to form defects 116. Defects 116 are formed at the interface between pocket 112 and well 110, as well as remaining exposed portions of the substrate 102.

Ion implantation 118 is employed such that dopants are applied at an implant dose range from, e.g., $10^{13}/cm^2$ to $10^{16}/cm^2$, with an implant energy range from, e.g., 10 KeV to 200 KeV, depending on the implant species. Ion implantation 118 may implant species such as, e.g., silicon, germanium, xenon, or any other suitable species. Ion implantation includes bombarding through UTBB 108 and pocket 112 with ions at angles of approximately 5 degrees to about 75 degrees with respect to a vertical-normal to a major surface of the device. Other angles of attack may also be employed. The parameters of the ion implantation may be adjusted such that defects 116 are formed at the interface between pocket 112 and well 110. It should be understood that other techniques for forming defects may also be employed.

Figure 5:
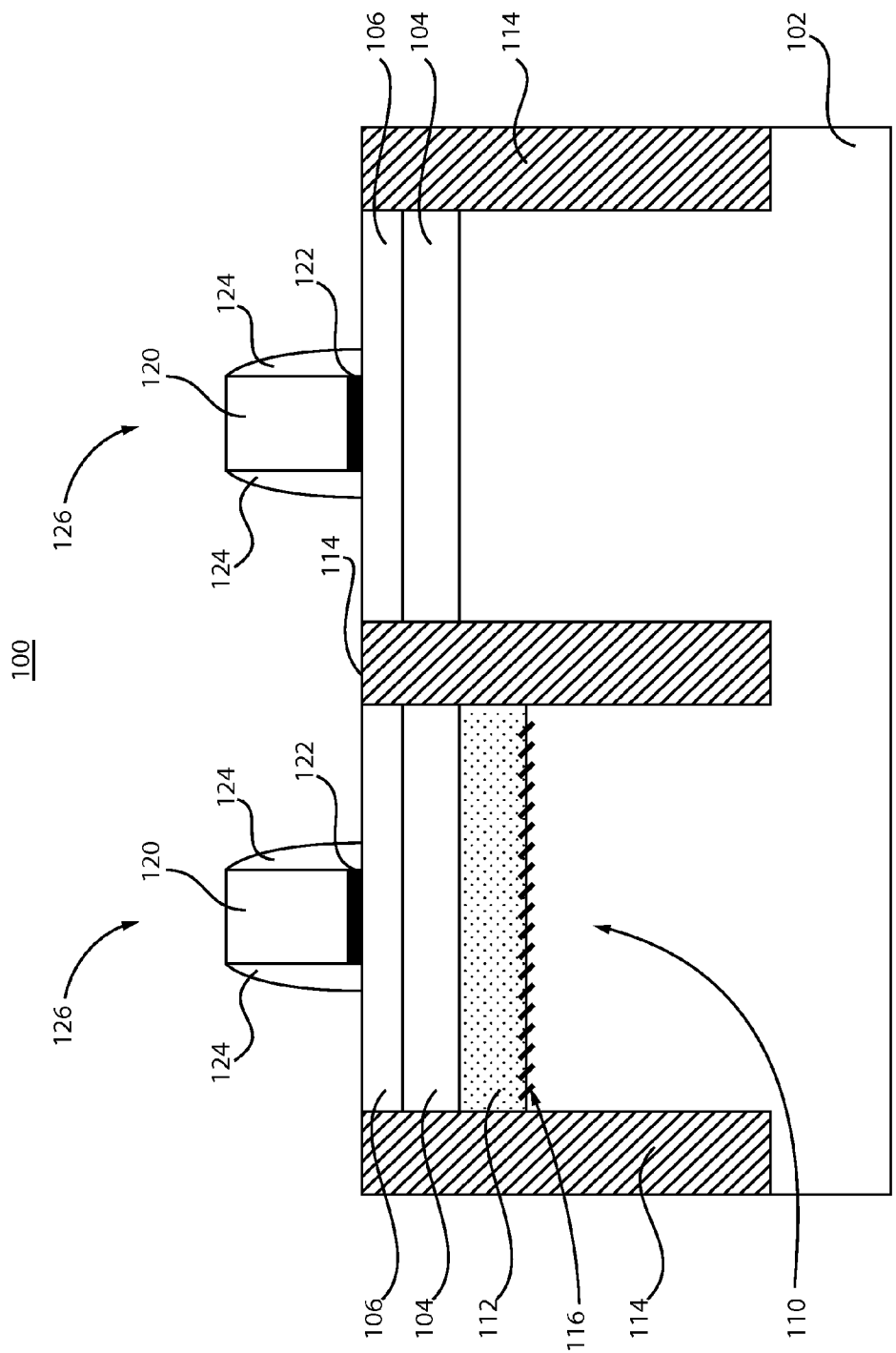
FIG. 5 is a cross-sectional view of a semiconductor device having defects at the intersection of the pocket and the well, with gate structures formed above the substrate, in accordance with one illustrative embodiment.

Referring now to FIG. 5, processing of the semiconductor device shown in FIG. 3 is continued. Gate structures 126 are formed over substrate 102. Gate structures 126 include gate electrodes 120 and gate dielectrics 122. The gate electrodes 120 may include any suitable conductive material, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The gate electrodes 120 may further comprise dopants that are incorporated during or after deposition.

The gate dielectric 122 may include a silicon oxide, silicon nitride, silicon oxynitride, organic dielectric, etc. In a preferred embodiment, gate dielectric 122 includes a high dielectric constant material, such as, e.g., metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, any suitable combination of those high-k materials, or any suitable combination of any high-k material with silicon oxide, silicon nitride, and/or silicon oxynitride.

The gate structures 126 also include spacers 124 formed on sidewalls thereof. The spacers 126 may include a nitride, for example. STI regions 114 reduce parasitic current and charge buildup between devices. Processing of the semiconductor structure 100 may continue, e.g., to form source/drain regions, etc.

Figure 6:
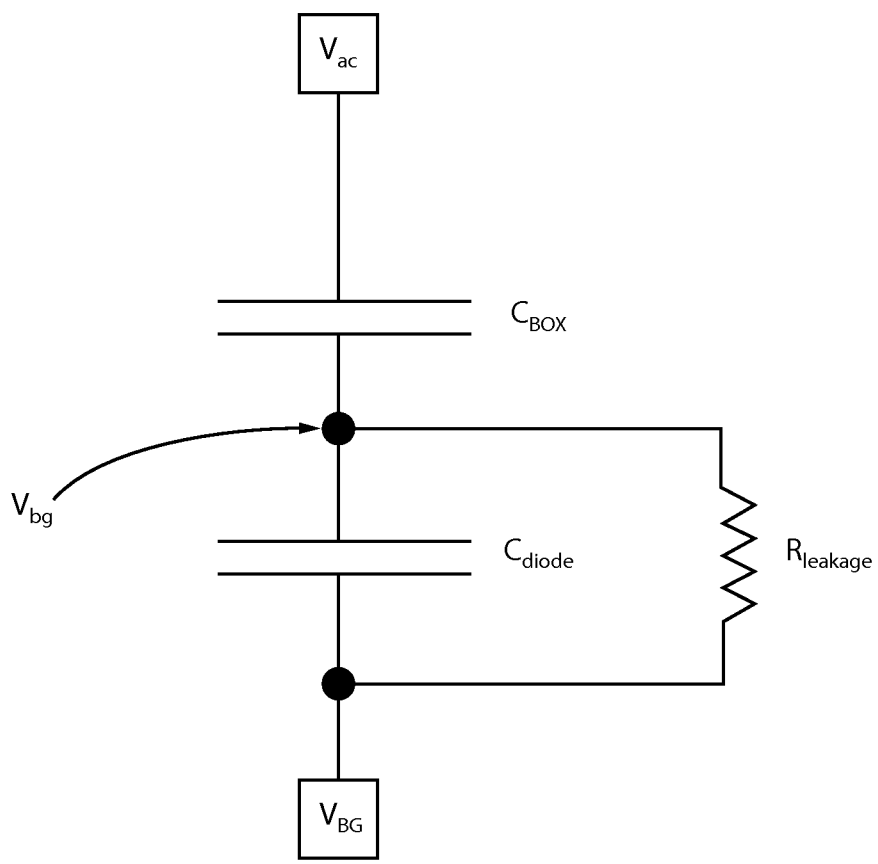
FIG. 6 is a schematic circuit diagram showing the voltage divider formed between the applied backgate voltage $V_{BG}$ and the voltage seen at the interface between the semiconductor on insulator (SOI) layer and BOX.

Referring now to FIG. 6, with continued reference to FIG. 5, a parasitic circuit 200 is illustratively depicted in accordance with one embodiment. A parasitic circuit is found between the source/drain terminals of a transistor to the well 110. $V_{ac}$ represents the voltage at the source/drain terminals of a transistor. $V_{BG}$ is the voltage applied to the well 110 and $V_{bg}$ is the voltage that is present at the interface between the BOX 104 and pocket 112. BOX 104 is represented by capacitor $C_{BOX}$, which typically has a value of 0.14 µF/cm² for a typical BOX thickness of 25 nm and dielectric constant of 3.9, which is dielectric constant of silicon dioxide. The p-n junction between the pocket 112 and well 110 is represented by capacitor $C_{diode}$, which is the depletion capacitor of the p-n junction (diode) and typically has a value of 0.2 μF/cm² for typical well doping of 5×10¹⁷ cm⁻³, pocket doping of 5×10¹⁸ cm⁻³ and a silicon substrate. The resistor $R_{leakage}$ represents the leakage due to defects 116. Thus, the effective potential at the backgate, $V_{bg}$, can be determined as follows:

$$V_{bg} = \frac{\left(\sqrt{1/\omega^2 R_{leakage}^2 + C_{diode}^2}\right)V_{BG} + C_{BOX}V_{AC}}{\sqrt{1/\omega^2 R_{leakage}^2 + (C_{diode} + C_{BOX})^2}} \quad (1)$$

where ω=2πf is the angular frequency of the ac signal.

The present principles provide for defects 116 formed at the interface of the well 110 and pocket 112 such that the p-n junction is leaky. In conventional approaches, where the p-n junction is not leaky, the equivalent resistance $R_{leakage}$ that represent the leakage current of the p-n junction is very large such that not all of the backgate voltage $V_{BG}$ appears at the interface between BOX and pocket.

By making the p-n junction between the well 110 and pocket 112 leaky, $R_{leakage}$ becomes small and the voltage divider, illustrated in equation (1), is changed from conventional approaches so that most of the AC signal drops on the back of the BOX 104. In the case where $R_{leakage}$ is very small, $V_{bg}=V_{BG}$.

Figure 7:
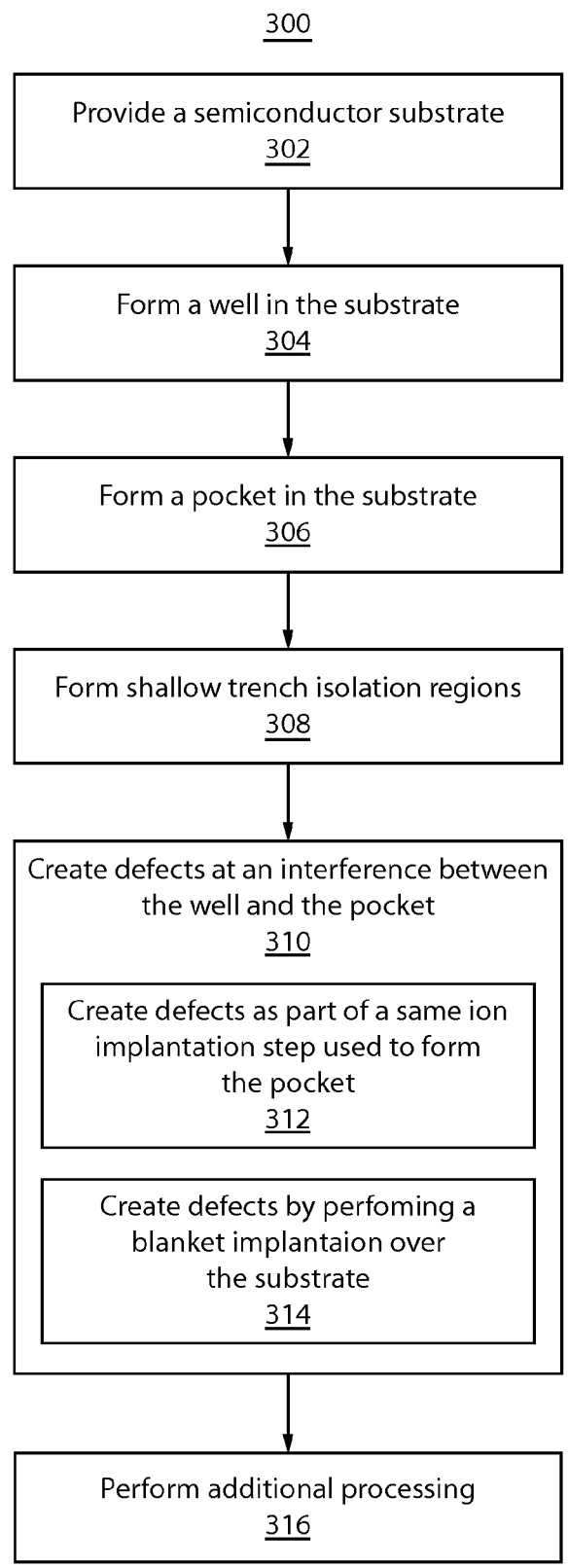
FIG. 7 is a block/flow diagram showing a system/method for forming defects at the intersection of a pocket and well, in accordance with one illustrative embodiment.

Referring now to FIG. 7, a block/flow diagram showing a method for fabricating a semiconductor device 300 is illustratively depicted in accordance with one embodiment. In block 302, a substrate is provided. The substrate preferably includes a first layer formed above a second layer, which are formed in or on the substrate. In a preferred embodiment, the first layer includes an ultrathin SOI layer and the second layer includes a thin BOX layer.

In block 304, portions of the substrate are doped such that a well is formed. This may involve, e.g., ion implantation, etc. In block 306, portions of the substrate are doped such that a pocket is formed underneath the BOX layer. The pocket adjusts the threshold voltage of transistors. The pocket may be formed by, e.g., ion implantation. The well and the pocket are formed such that a p-n junction is formed at the interface between the pocket and the well. In block 308, STI regions are formed by conventional methods. It is to be understood that STI regions may be formed before and/or after the formation of the well and the pocket.

In block 310, defects are created at an interface between the well and the pocket. The interface is preferably the p-n junction between the well and the pocket. Defects may include end-of-range defects or impurities that generate mid-gap states. Defects cause the p-n junction between the well and the pocket to be leaky, such that during AC operation, most of the applied voltage drops at the interface of the BOX layer and the pocket.

In block 312, defects are created as part of the implantation of the pocket (from step 306). Since defects are formed as part of the pocket implantation, defects are not formed where the pocket is not formed. In block 314, defects are created by performing a blanket implantation over the substrate. The blanket implantation forms defects at the interface between the pocket and the well, as well as remaining exposed portions of the substrate.

In block 315, additional processing may be performed to, e.g., form gate structures, spacers, source/drain regions, etc.

Having described preferred embodiments of a system and method for defective p-n junction for backgated fully depleted silicon on insulator MOSFET (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for semiconductor fabrication, comprising:
    forming a well in a semiconductor substrate, the semiconductor substrate including a semiconductor on insulator (SOI) layer present on a buried dielectric layer, the buried dielectric layer being present on a base semiconductor layer, wherein the well region is present within the base semiconductor layer;
    forming a pocket within the well region directly underlying the buried dielectric layer, the pocket having an opposite doping polarity as the well to provide a p-n junction between the well and the pocket;
    creating defects at the p-n junction such that a leakage resistance of the p-n junction is decreased.

2. The method as recited in claim 1, wherein creating defects includes creating defects as part of a same implantation used to form the pocket.

3. The method as recited in claim 1, wherein creating defects includes using a same mask used to form the pocket to apply a separate implantation.

4. The method as recited in claim 1, wherein creating defects includes performing a blanket implantation over the substrate.

5. The method as recited in claim 1, wherein the defects include end-of-range implant defects.

6. The method as recited in claim 1, wherein the defects include impurities that generate mid-gap states.

7. The method as recited in claim 1, wherein creating defects includes creating defects inside a depletion region associated with the p-n junction.

8. A method for semiconductor fabrication, comprising:
    forming a well in a semiconductor substrate;
    forming a pocket within the well, the pocket having an opposite doping polarity as the well to provide a p-n junction between the well and the pocket, wherein the pocket is formed directly under an isolation layer or LUG semiconductor substrate;
    creating defects at the p-n junction such that a leakage resistance of the p-n junction is decreased, wherein the defects are created as part of a same implantation used to form the pocket.

9. The method as recited in claim 8, wherein the same implantation includes using a same mask used to form the pocket.

10. The method as recited in claim 8, wherein the defects include end-of-range implant defects.

11. The method as recited in claim 8, wherein the defects include impurities that generate mid-gap states.

12. The method as recited in claim 8, wherein creating defects includes creating defects inside a depletion region associated with the p-n junction.

13. The method as recited in claim 8, wherein the isolation layer includes a buried oxide (BOX) layer and the semiconductor substrate includes a silicon-on-insulator (SOI) layer formed over the BOX layer.

14. A semiconductor device, comprising:
- a semiconductor substrate having a well formed therein, the semiconductor substrate including a semiconductor on insulator (SOI) layer present on a buried dielectric layer, the buried dielectric layer being present on a base semiconductor layer, wherein the well region is present within the base semiconductor layer;
- a pocket formed within the well directly underlying the buried dielectric layer, the pocketing having an opposite doping polarity as the well to provide a p-n junction between the well and the pocket; and
- defects created at the p-n junction such that a leakage resistance of the p-n junction is decreased.

15. The semiconductor device as recited in claim 14, wherein defects are created inside a depletion region associated with the p-n junction.

16. The semiconductor device as recited in claim 14, wherein the semiconductor substrate includes a semiconductor-on-insulator (SOI) layer formed over a buried dielectric layer.

17. The semiconductor device as recited in claim 16, wherein the SOI layer includes an ultrathin SOI layer.

\* \* \* \* \*